United States Patent
Tsurumi (10) Patent No.: US 9,522,827 B2
(45) Date of Patent: Dec. 20, 2016

(54) PIEZOELECTRIC MATERIAL, PIEZOELECTRIC MEMBER, PIEZOELECTRIC ELEMENT, AND PRESSURE SENSOR

(71) Applicants: Energy Storage Materials LLC, Fujisawa-shi, Kanagawa (JP); Sakai Chemical Industry Co., Ltd., Sakai-shi, Osaka (JP)

(72) Inventor: Takaaki Tsurumi, Kanagawa (JP)

(73) Assignees: Energy Storage Materials LLC, Kanagawa (JP); Sakai Chemical Industry Co., Ltd., Osaka (JP)

( * ) Notice: Subject to any disclaimer, the term of this patent is extended or adjusted under 35 U.S.C. 154(b) by 803 days.

(21) Appl. No.: 13/875,853

(22) Filed: May 2, 2013

(65) Prior Publication Data

US 2014/0327340 A1 Nov. 6, 2014

(51) Int. Cl.
*H01L 41/187* (2006.01)
*H01L 41/047* (2006.01)
(Continued)

(52) U.S. Cl.
CPC .............. *C01B 33/26* (2013.01); *C30B 15/00* (2013.01); *C30B 29/34* (2013.01); *C30B 33/06* (2013.01);
(Continued)

(58) Field of Classification Search
CPC .... H01L 41/187; H01L 41/18; H01L 41/0926; H01L 41/22; H01L 41/083; C04B 35/495; C04B 35/48; C04B 35/51; C04B 35/478; C04B 2235/3201; C04B 35/46; C04B 35/50; C04B 35/49; C04B 2235/3251; H01B 3/12
(Continued)

(56) References Cited

U.S. PATENT DOCUMENTS 4,820,445 A * 4/1989 Piekarczyk et al. ... 252/301.4 R
5,422,319 A * 6/1995 Stempin ................... C03C 8/02
428/367

(Continued)

FOREIGN PATENT DOCUMENTS

JP 2001064638 A * 3/2001 ............. C09K 11/00
JP EP1 221 727 A2 * 7/2002 ............. H01L 41/18

OTHER PUBLICATIONS

Takeda et al., Applied Physics Letters, "Calcium aluminate silicate Ca2Al2SiO7 single crystal applicable to piezoelectric sensors at high temperature", pp. 1-10, 2013.*
Pereira da Cunha, High Temperature Sensing Technology for Applications Up to 1000? C, pp. 752-753, (2008 publication date) IEEE Sensors 2008 Conference, United States of America.†
Chun, Effect of the Firing Conditions on the Phase Formation of Alkali Metal Niobate Piezoelectric Ceramics, p. 2583, (2011 publication date) Journal of the Korean Physical Society, South Korea.†
Cady, Piezoelectricity an Introduction to the Theory and Applications of Electromechanical Phenomena in Crystals, pp. 9-21, 80-83, 180-183, and 469-481 (1964 publication date) Dover Publications, Inc. United States of America.†

(Continued)

*Primary Examiner* — Thomas Dougherty
(74) *Attorney, Agent, or Firm* — Hamre, Schumann, Mueller & Larson, P.C.

(57) ABSTRACT

The present invention has an object to provide a piezoelectric material that endures high temperatures, the resources of raw materials of which are abundant, and that is stably suppliable. Disclosed is a piezoelectric element, including: a piezoelectric member having a surface for receiving external stress and a side surface that is perpendicular to the surface for receiving external stress; and at least one pair of a first electrode and a second electrode that are placed on the side surface, the first electrode being provided so as to separate from the second electrode. The piezoelectric member is preferably cut out from a piezoelectric material that includes gehlenite ($Ca_2Al_2SiO_7$) in a predetermined crystal orientation. The piezoelectric member utilizes a transverse piezoelectric effect, and is preferably a (XYt) 45°-cut piece. The electrodes are preferably provided on surfaces that are parallel to the YZ plane.

8 Claims, 9 Drawing Sheets

(51) Int. Cl.

| | |
|---|---|
| *H01L 41/113* | (2006.01) |
| *C01B 33/26* | (2006.01) |
| *G01L 1/16* | (2006.01) |
| *H01L 41/18* | (2006.01) |
| *C30B 15/00* | (2006.01) |
| *C30B 29/34* | (2006.01) |
| *C30B 33/06* | (2006.01) |
| *G01L 23/10* | (2006.01) |
| *H01L 41/41* | (2013.01) |

(52) U.S. Cl.
CPC .............. *G01L 1/16* (2013.01); *G01L 23/10* (2013.01); *H01L 41/18* (2013.01); *H01L 41/41* (2013.01)

(58) Field of Classification Search
USPC ........ 310/358, 363–366, 333, 338; 501/134; 252/62.9 R, 62.9 PZ
See application file for complete search history.

(56) References Cited

U.S. PATENT DOCUMENTS

| | | | | |
|---|---|---|---|---|
| 5,852,245 | A * | 12/1998 | Wesling et al. | ........... 73/723 |
| 8,074,524 | B2 † | 12/2011 | Staiger | |
| 2005/0074638 | A1 * | 4/2005 | Neubert | ........ B32B 18/00 |
| | | | | 428/701 |
| 2007/0199376 | A1 * | 8/2007 | Cavalloni et al. | ........... 73/167 |
| 2007/0257232 | A1 * | 11/2007 | Tai et al. | ........... 252/301.36 |
| 2009/0294051 | A1 * | 12/2009 | Traggis et al. | ........... 156/275.5 |
| 2012/0091861 | A1 * | 4/2012 | Kim et al. | ........... 310/363 |

OTHER PUBLICATIONS

IEEE, IEEE Standard on Piezoelectricity, pp. Foreward-55 (1988 publication date) The Institute of Electrical and Electronics Engineers, Inc., United States of America.†

Louisnathan, Refinement of the Crystal Structure of a Natural Gehlenite, Ca2Al(Al,Si) 207, pp. 822-837, (1971 publication date), the Canadian Mineralogist, Canada.†

Kimata, The structural property of synthetic gehlenite, Ca2Al2SiO7, abstract, (1982 publication date), E. Schweizerbart'sche, Stuttgart Germany.†

Finch, Czochralski growth of single-crystal gehlenite, (Ca2Al2SiO7), abstract, (1981 publication date), Journal of Crystal Growth, United States of America.†

Burshtein, Refractive-index anisotropy and dispersion in gehlenite, Ca2Al2SiO7 between 308 and 1064 nm, abstract, (1993 publication date) Optical Society of America, United States of America.†

Gautschi, Piezoelectric Sensorics, pp. 76-77, (2002 publication date) Springer, Germany.†

Zhang, Growth and Piezoelectric Properties of Melilite ABC3O7 Crystals, pp. 622-628, (2011 publication date) American Chemical Society Publications, United States of America.†

Thiele, Platinum and Palladium High-Temperature Transducers on Langasite, abstract, (2005 publication date) Ultrasonics, Ferroelectrics, and Frequency Control, IEEE Transactions, United States of America.†

* cited by examiner
† cited by third party

Direction of porarization of electric charges

Stress (Pressure)

PIEZOELECTRIC MATERIAL, PIEZOELECTRIC MEMBER, PIEZOELECTRIC ELEMENT, AND PRESSURE SENSOR

BACKGROUND OF THE INVENTION

1. Technical Field

The present invention relates to a piezoelectric material, a piezoelectric member, a piezoelectric element, and a pressure sensor which endure hot environments.

2. Description of the Related Art

Sensors and actuators utilizing piezoelectric elements have been widely used in various applications. It has been expected to use piezoelectric materials which endure hot environments of several hundreds degrees Celsius in such applications as combustion pressure sensors of engines, ultrasonic sensors for continuous monitoring of high-temperature plants in thermal power plants.

Characteristics required for a piezoelectric material which endures hot environments are, for example, that (A) the piezoelectric material should have any phase transition point and any Curie point; (B) the piezoelectric material should have a high melting point; and (C) the piezoelectric material should maintain electric insulation even at a high temperature, etc. Furthermore, it is preferred that (D) resources for raw materials are abundant; (E) conventional techniques for growing crystal can be employed; and (F) large size crystals can easily be produced.

Some piezoelectric materials which can work in hot environments have been reported. Typical examples thereof include (1) quartz ($SiO_2$), (2) gallium phosphate ($GaPO_4$) (for example, see JP 6-326552 A), (3) langasite that contains rare earth elements ($La_3Ga_5SiO_{14}$, $La_3Ta_{0.5}Ga_{5.5}O_{14}$, $La_3Ta_{0.5}Ga_{5.5-x}Al_xO_{14}$) (for example, see JP 10-54773 A, JP 2005-16984 A, and JP 2010-185852 A), (4) four-component langasite type crystal ($Ca_3TaGa_3Si_2O_{14}$) (for example, see JP 2010-185852 A), and (5) rare-earth calcium oxoborate ($YCa_4O(BO_3)_3$).

BRIEF SUMMARY OF THE INVENTION

The above piezoelectric materials, however, have the following characteristics and defects.

(1) Quartz

Quartz has a stable piezoelectric constant, but has a phase transition point at around 580° C. When the temperature of quartz exceeds the phase transition point, the piezoelectric constant falls to half or less.

(2) Gallium Phosphate

Gallium phosphate shows high insulation and has a stable piezoelectric property. But production thereof is difficult in that hydrothermal synthesis is required as a method for constructing crystals. Thus, stable supply may be difficult. In addition, gallium, which is one of rare metals, is used as a raw material.

(3) Langasite that Contains Rare Earth Elements

Rare earth containing langasite has a stable piezoelectric property, but is remarkably poor in insulation at a higher temperature. Further, rare earth substances, and tantalum and gallium, which are rare metals, are used as raw materials.

(4) Four-Component Langasite

Four-component langasite shows high insulation and has a stable piezoelectric property, but tantalum and gallium, which are rare metals, are used as raw materials.

(5) Rare-Earth Calcium Oxoborate

Rare-earth calcium oxoborate shows high insulation, but the piezoelectric property varies greatly with temperature change. In addition, rare earth substances are used as raw materials.

Thus, crystals which are available as conventional piezoelectric materials have both advantages and drawbacks. Piezoelectric materials which endure hot environments, the resources of raw materials of which are abundant, and which are stably suppliable have not been found yet.

In view of the above state of the art, the present invention has an object to provide a piezoelectric material which endures high temperatures, the resources of raw materials of which are abundant, and which is stably suppliable. The present invention also has an object to provide a piezoelectric member that uses the piezoelectric material, a piezoelectric element that uses the piezoelectric member, and a pressure sensor that uses the piezoelectric element.

The present invention has made for solving the above problems. That is, according to a first aspect of the present invention, a piezoelectric material comprising gehlenite represented by the compositional formula $Ca_2Al_2SiO_7$ is disclosed. Such a piezoelectric material shows an excellent thermal stability on piezoelectric constant and will maintain electric resistivity within the range from a room temperature to a hot environment such as at a temperature over 800° C.

According to a second aspect of the present invention, a piezoelectric member comprising the piezoelectric material of the first aspect of the invention is disclosed. Such a piezoelectric member includes the piezoelectric material of the first aspect of the invention, and thus the characteristics of the piezoelectric material depend on the electric properties of the piezoelectric material. Therefore, the piezoelectric member maintains excellent thermal stability within the range from a room temperature to a hot environment. The piezoelectric member may contain any minor ingredients in addition to the piezoelectric material, and also may contain any unavoidable impurities which may be generated in the manufacturing process.

According to a third aspect of the present invention, disclosed is a piezoelectric element, including: the piezoelectric member according to the second aspect of the invention, the member having a surface for receiving external stress and a side surface that is perpendicular to the surface for receiving external stress; and at least one pair of a first electrode and a second electrode that are placed on the side surface such that the first electrode should be separated from the second electrode. Such a piezoelectric element functions as a piezoelectric element that utilizes a transverse piezoelectric effect.

In a preferred embodiment of the piezoelectric element, the electrodes are provided such that the electrodes should cover substantially the whole of the side surface. Such a piezoelectric element can effectively detect electric charges that are generated through a transverse piezoelectric effect.

In another preferred embodiment of the piezoelectric element, the piezoelectric member is cut out from a crystal of the piezoelectric material along with an (XYt) 45° orientation. Such a piezoelectric element can effectively utilize a piezoelectric effect.

In another preferred embodiment of the piezoelectric element, the electrodes are made of a material selected from the group consisting of Pt, Pd, and Ag—Pd alloy. Such a piezoelectric element works even under a hot environment such as at a temperature over 800° C.

According to a fourth aspect of the present invention, disclosed is a pressure sensor that includes a diaphragm and a piezoelectric element according to the third aspect of the invention. In such a pressure sensor, stress caused by external pressure applied on the diaphragm is transmitted to a stress-receiving surface of the piezoelectric member, and electric charges generated in the piezoelectric member by the thus-transmitted stress are detected via the electrodes.

BRIEF DESCRIPTION OF THE DRAWINGS

FIG. 5 is a schematic diagram of the piezoelectric element according to the second embodiment of the present invention and a variant thereof.

FIG. 6 is a schematic diagram illustrating the pressure sensor of the third embodiment of the present invention.

DETAILED DESCRIPTION OF THE INVENTION

Hereafter, embodiments of the present invention are explained with appropriately referring to drawings. In the present invention, gehlenite, one of melilite-type crystals, is used as a piezoelectric material for a piezoelectric element that endures hot environments.

Gehlenite has characteristics which may satisfy the above requirements (A) to (F). That is, (a) gehlenite has a crystal structure that shows piezoelectricity; (b) gehlenite consists of elements which is abundantly present in the earth crust (Clarke number is large); (c) gehlenite has a high proportion of covalent bonds and ion bonds in the total chemical bonds, and (d) the Czochralski method, which can provide a large crystal, is applicable to gehlenite.

Gehlenite is represented by the compositional formula $Ca_2Al_2SiO_7$. That is, gehlenite only includes, as constituent elements, elements in the top ten in Clarke numbers such as Ca (calcium: fifth place in Clarke number), Al (aluminum: third place), Si (silicon: second place) and O (oxygen: first place). Additionally, large size crystals of gehlenite can be produced by the Czochralski method. Further, Gehlenite is free of elements which can cause a high environmental impact, such as Pb (lead).

Although details will be described later, gehlenite, which serves as a piezoelectric material, shows a stable piezoelectric constant (piezoelectric property) and maintain high electric resistivity even at a high temperature. That is, gehlenite used as a piezoelectric material contributes to provide a piezoelectric element that endures a hot environment.

First Embodiment

Structure of the Piezoelectric Element

Figure 1:
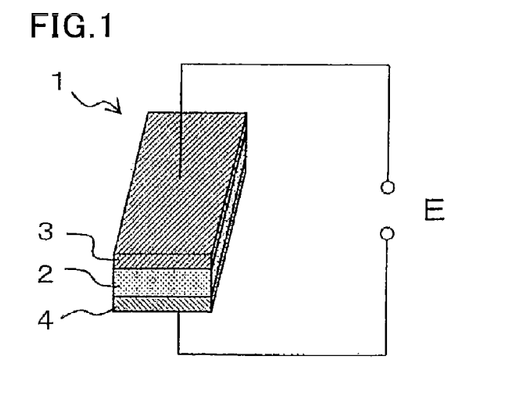
FIG. 1 is a schematic diagram of the piezoelectric element according to the first embodiment of the present invention.

Firstly, the structure of the piezoelectric element according to a first embodiment of the present invention will be described with referring to FIGS. 1 and 2. Piezoelectric element 1 according to the first embodiment, which is illustrated in FIG. 1, includes a piezoelectric member 2 and electrodes 3 and 4.

Piezoelectric element 1 includes a piezoelectric member 2 in a shape of a rectangular parallelopiped, which is cut out in a predetermined crystal orientation, and a pair of electrodes 3 and 4, which are provided such that an electrode should be separated from another (in this embodiment, electrodes are placed opposite each other), on the surface of the piezoelectric member 2. When piezoelectric member 2 is deformed in response to the applied stress, electric charges generate on the surface of the piezoelectric member 2 by the piezoelectric effect, depending on the volume of stress, that is, the volume of deformation. These electric charges generate voltage E between electrodes 3 and 4. Reversely, application of voltage E between electrodes 3 and 4 deforms piezoelectric member 2 according to the applied voltage as an inverse piezoelectric effect.

This piezoelectric element 1 can be applied to various sensors such as pressure sensors or ultrasonic sensors by utilizing a piezoelectric effect. The piezoelectric element 1 can also be applied to oscillators, actuators, etc., by utilizing an inverse piezoelectric effect.

When piezoelectric element 1 is used as a sensor, electric charges generated on the surface of the piezoelectric member 2 are detected via electrodes 3 and 4. The detection of electric charges herein includes detection (measurement) of some physical quantity that is derived from electric charges generated by the stress applied on the piezoelectric member 2. For example, the "detection of electric charges" includes detection (measurement) of quantity of electricity of generated electric charges, or detection (measurement) of voltage between electrodes 3 and 4 caused by generated electric charges.

When gehlenite is used as the piezoelectric member 2, it serves as the piezoelectric element 1 that utilizes a transverse piezoelectric effect ($d_{31}$ mode). The "transverse piezoelectric effect" means a piezoelectric effect in which polarization of electric charges is caused by stress in a direction orthogonal to the direction of application of the stress. In this embodiment, ends of a rectangular parallelopiped of the piezoelectric member 2 in the longitudinal direction (in FIG. 1, the front face and back face of the page) are stress-receiving surfaces. Thus, polarized electric charges generate on the surfaces of the piezoelectric member 2 in a direction orthogonal to a direction along a normal of a stress-receiving surface, which is a direction of stress applied (in FIG. 1, the longitudinal direction of the page). Electrodes 3 and 4 are provided on the surfaces on which electric charges generate.

Under a transverse piezoelectric effect, polarized electric charges generate on the surfaces of piezoelectric member 2 in other directions orthogonal to the direction of application of stress (for example, in the lateral direction of the page in FIG. 1). Thus, in place of, or in addition to electrodes 3 and 4 that are provided on the surfaces in the longitudinal direction, another pair of electrodes may be provided on the side surface such that an electrode should be separated from and opposite to another (in FIG. 1, the lateral sides of the page).

(Piezoelectric Member)

The piezoelectric member 2 is a rectangular parallelopiped piece (a plate-like piece) of crystal that is cut out from crystal bulk of gehlenite in a predetermined crystal orientation. As illustrated in FIG. 2, a coordinate system is defined on tetragonal gehlenite such that two a-axes of a unit cell should be read as X and Y axes, respectively, and c-axis should be read as Z-axis. Here, it is preferable to prepare a rectangular parallelopiped crystal piece known as an "(XYt) 45°-cut" piece (in FIG. 2, a cut piece represented by the piece II or III), which is cut out along the following planes: planes parallel to a plane (YZ plane) whose normal is along the X-axis, planes parallel to a plane whose normal is along an axis tilted 45° from the Y-axis around the X axis, and planes parallel to a plane whose normal is along an axis tilted 45° from the Z-axis around the X axis. Thus-cut piezoelectric member 2 is preferable because a large piezoelectric effect will be exerted. Here, when stress is applied in the direction along the axis tilted 45° from the Y-axis around the X axis (the direction in which stress is applied), polarization will be caused on the surfaces of the piezoelectric member 2 in the X-axis direction, that is, positive and negative electric charges will generate on the surfaces ("electric charge-generating surface") which is parallel to the XY plane, depending on the magnitude of the applied stress. Electrodes 3 and 4 are respectively provided on two electric charge-generating surfaces, which is parallel to the XY plane.

As mentioned above, under a transverse piezoelectric effect, polarized electric charges generate on the surfaces of piezoelectric member 2 in other directions orthogonal to the direction of application of stress. That is, polarized electric charges will generate in the direction along an axis tilted 45° from the Z-axis around the X axis. Thus, the piezoelectric element may be constructed by providing electrodes on surfaces whose normal is along the axis tilted 45° from the Z-axis around the X axis.

A crystal piece cut out along another crystal orientation may be used as the piezoelectric member 2. The shape of the piezoelectric member 2 is not limited to a rectangular parallelopiped shape, and may be any shape such as a discoid or a rod. Even when the piezoelectric member has a discoid shape or a rod shape, at least one pair of a first electrode and a second electrode may be provided on the side faces perpendicular to the surface for receiving external stress such that the first electrode should be separated from the second electrode.

(Electrodes)

Electrodes 3 and 4 are provided on the respective "electric charge-generating surfaces" of the rectangular parallelopiped piezoelectric member 2. The "electric charge-generating surfaces" are surfaces (side faces) orthogonal to a stress-receiving surface to which stress is applied. The electrodes 3 and 4 are provided on the "electric charge-generating surfaces" such that they are separated from each other, preferably opposite each other. The electrodes 3 and 4 may be made of a metallic material having a higher melting point than the temperature of hot environments in which piezoelectric element 1 is to be used. Examples of materials that endure a hot environment, preferably an environment over 800° C., include Pt (platinum), Pd (palladium), and Ag—Pd alloy. Ag paste may be used alternatively when the piezoelectric element 1 is used in a relatively low temperature condition.

The electrodes 3 and 4 may be respectively provided on a first surface and a second surface that is opposite the first surface, normally by a technique such as application, deposition, plating, or spattering, using materials mentioned above. It is preferred that the electrodes 3 and 4 are respectively provided on the two surfaces that are parallel to the YZ plane when the piezoelectric member 2 is an (XYt) 45°-cut crystal piece.

[Production of the Piezoelectric Element]

Figure 2:
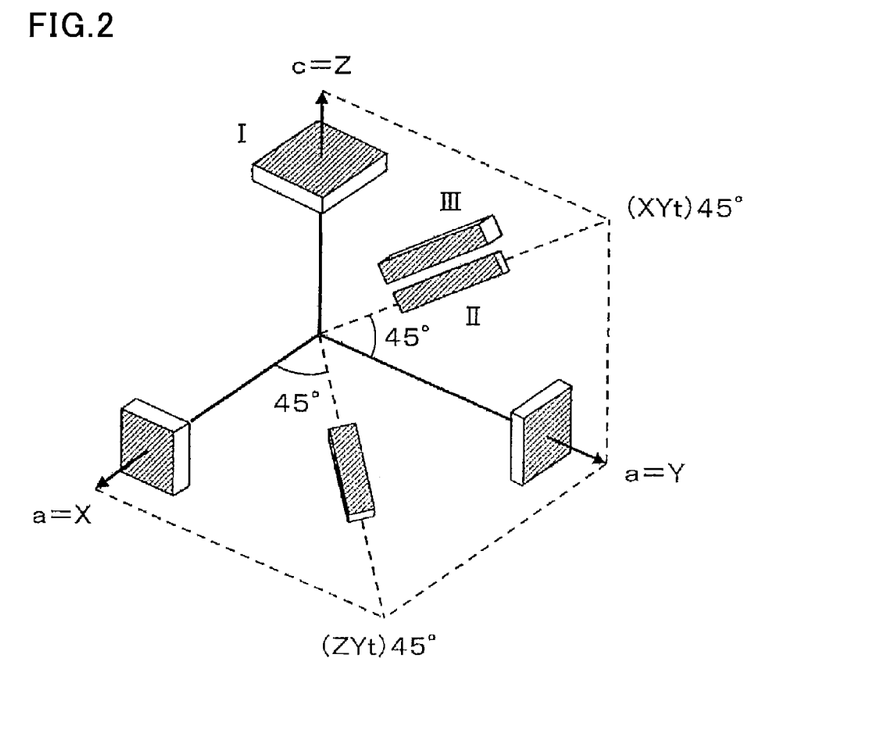
FIG. 2 is a view for explaining cutting direction of the piezoelectric member according to the first embodiment of the present invention.
Figure 3:
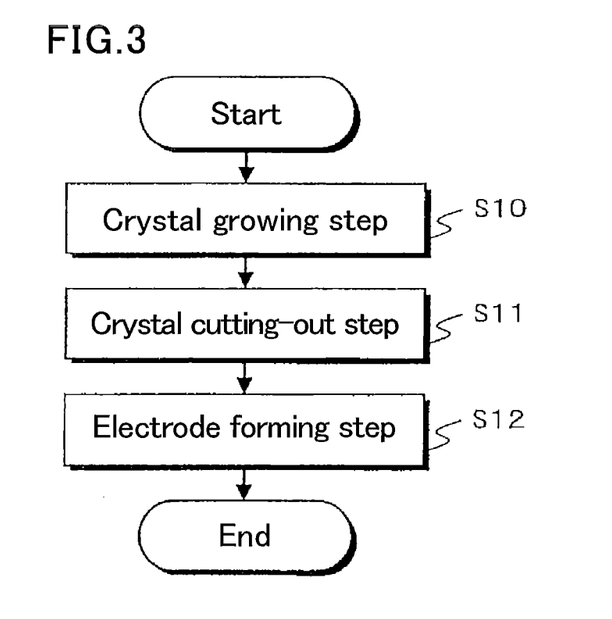
FIG. 3 is a flow chart for illustrating a production flow of the piezoelectric element according to the first embodiment of the present invention.

Next, a production process of the piezoelectric element 1 is described referring to FIG. 3 (together with FIGS. 1 and 2, if needed).

As illustrated in FIG. 3, the production process includes: a crystal growing step S10 of producing crystal bulk of gehlenite, which is one of piezoelectric materials; a crystal cutting-out step S11 of cutting out a piezoelectric member 2 from the crystal bulk in a predetermined crystal orientation; and an electrode forming step S12 of forming the electrodes 3 and 4 on predetermined surfaces on which the electric charges will generate (electric charge-generating surface) of the piezoelectric member 2. These steps are carried out in the order of S10, S11, and S12.

(Crystal Growing Step)

First, in the crystal growing step S10, crystal bulk of gehlenite, which is one of piezoelectric materials, is produced. The crystal bulk may be produced as a monocrystalline rod in a manner called the Czochralski method. The Czochralski method is employed as a process for producing semiconductor materials. Crystal bulk which is to be used in the present invention may be produced in an apparatus for growing crystals similar to an apparatus for producing semiconductor materials.

Figure 4:
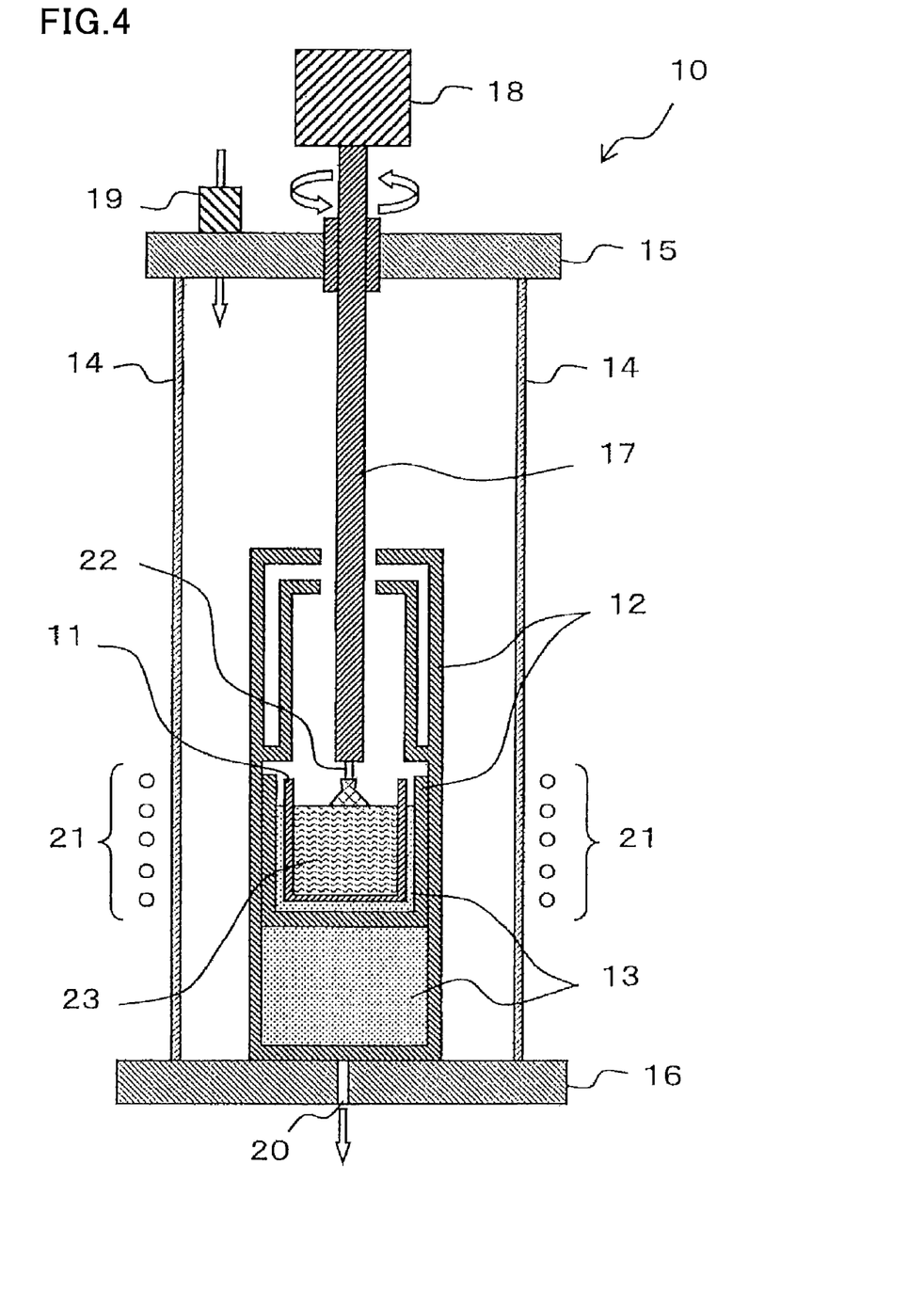
FIG. 4 is a schematic diagram illustrating a structure of an apparatus for growing crystals of the piezoelectric material, which is used for the piezoelectric element of the first embodiment of the present invention.

Then, an example of an apparatus for growing crystals by the Czochralski method is explained referring to FIG. 4. As illustrated in FIG. 4, an apparatus 10 for growing crystals is equipped with a crucible 11, a crucible 12, alumina bubbles 13, a quartz tube 14, a top cover 15, a bottom cover 16, a rod 17 for drawing up a crystal, a load cell 18, a gas inlet 19, an exhaust outlet 20, and a heater 21.

The crucible 11 is a receiver for storing melt 23 of raw materials. Raw materials are charged in crucible 11, and then heated by the heater 21 to melt. In this embodiment, to hold gehlenite, which melts at a high temperature (melting point: around 1780° C.), a crucible made of Ir (iridium), which is a metal having a higher melting point (melting point: around 2460° C.) than gehlenite, is used.

The crucible 12 is arranged so as to surround the crucible 11 and a region for drawing up a crystal, and partially has a double structure so that it should be thermally retained well. In this embodiment, the crucible 12 is made of zirconia ($ZrO_2$).

In a space between the crucibles 11 and 12, alumina bubbles 13 are filled. Alumina bubbles 13 are hollow sphere particles of alumina ($Al_2O_3$). Filling the space between the crucibles 11 and 12 with the alumina bubbles 13 will prevent the crucible 11 made of iridium from deforming, and improve heat-retaining property around the crucible 11.

A quartz tube 14 is a casing for covering the outside of the crucibles 11 and 12, which are reaction sites, and isolating the inside space from the external atmosphere to maintain the reaction atmosphere. Top and bottom openings of the quartz tube 14 are sealed with a top cover 15 and a bottom cover 16.

Top cover 15 and bottom cover 16 are provided at the top end and the bottom end of quartz tube 14, respectively, to hold a reaction atmosphere in combination with the quartz tube 14.

The top cover 15 has, at its center, a bearing to support a rod 17 for drawing up a crystal such that the rod 17 should be rotatable around the axis of the rod 17 and slidable in the axis direction. The top cover 15 has a gas inlet 19 to control the reaction atmosphere, and is designed to supply gas such as Ar (argon) gas or nitrogen gas.

The bottom cover 16 has an exhaust outlet 20.

The rod 17 for drawing up a crystal is provided for holding a seed crystal 22 at the tip (i.e. the bottom end in FIG. 4) and drawing up a crystal from melt of raw materials stored in crucible 11. The upper part of the rod 17 is held by a load cell 18, and is configured to be rotatable around the center axis of the rod with the help of a motor (not shown), and slidable in the axis direction.

The load cell 18 serves as a load meter which holds the upper part of the rod 17 and weighs the rod 17 and a crystal grown around the bottom end of the rod. When the weight of the grown crystal weighed by the load cell 18 reaches a predetermined weight, the apparatus 10 for growing crystals will be controlled to terminate growth of the crystal.

The top cover 15 has a gas inlet 19 thereon. The gas inlet 19 is a means for controlling supply of gas into the inside of the quartz tube 14 to control reaction atmosphere, such as a valve.

Examples of gas to be supplied to control reaction atmosphere include inert or low-reactive gases such as argon gas and nitrogen gas. Furthermore, a small amount of oxygen gas may be combinedly introduced to the inside of the quartz tube 14 together with the above gas so as to prevent generation of oxygen defect in the product crystal.

The bottom cover 16 has an exhaust outlet 20, which serves as an outlet of flow of gas supplied from gas inlet 19.

A heater 21 is a heating means for melting raw materials in the crucible 11. In this embodiment, an RF (radio frequency) coil is provided as the heater 21 such that the RF coil surrounds the outer periphery of a region of the quartz tube 14 in which the crucible 11 are placed.

The heater 21 is designed so that electrifying the RF coil produces a magnetic field in the RF coil, and the magnetic field generates induced current on the metal crucible 11, to thereby heat the crucible 11 to a high temperature. Thus, raw materials in the crucible 11 are melted.

The heater 21 is not particularly limited to a high frequency induction heating means, and may be any other heating means such as a heater.

A seed crystal 22 serves as a core of a growing crystal on drawing up a crystal from the melt 23. The seed crystal 22 is preferably a single crystal (monocrystal) consisting of the same substance as the crystal to be grown. Ceramics (polycrystalline substance) having the same composition as the crystal to be grown may be used as the seed crystal 22. Also, a platinum rod or an iridium rod may be used instead.

As the seed crystal 22, a prismatic crystal is preferred, although it is not limited to. The size of the seed crystal 22 may be appropriately determined depending on the size of the crucible 11 which holds the melt 23 or the size of the grown crystal. As an Example, when the crucible 11 is in a cylindrical shape with an inner diameter of 50 mm and a height of 50 mm, a prism seed crystal with a section of from 3 mm×3 mm to 5 mm×5 mm and a height of from 20 to 50 mm may be used.

Then, the crystal growing step S10 of producing crystal bulk of gehlenite is described. The crystal growing step S10 may be carried out in an apparatus 10 for growing crystals illustrated in FIG. 4.

First, raw materials, including powdery calcium carbonate ($CaCO_3$), aluminum oxide ($Al_2O_3$), and silicon oxide ($SiO_2$), are weighed according to the composition of gehlenite ($Ca_2Al_2SiO_7$), that is, in a molar ratio of 2:1:1, and then mixed.

Next, powdery mixture of the raw materials is put in the crucible 11, and the crucible 11 is placed in an apparatus 10 for growing crystals. Argon gas or nitrogen gas is then introduced from the gas inlet 19, to prepare reaction atmosphere. Here, an additional small amount of oxygen gas may be introduced together from the gas inlet 19. If a crystal of an oxide such as gehlenite contains oxygen defects in the crystal, such oxygen defect in the crystal may cause electric resistance. Thus, such crystal is unfavorable as a piezoelectric material. Addition of a small amount of oxygen gas can suppress generation of such oxygen defects in the produced gehlenite crystal.

At the tip of the rod 17 for drawing up crystals, a seed crystal 22 is fixed. As described above, seed crystal 22 is preferably a single crystal (monocrystal) of gehlenite, but may be a ceramics (polycrystalline substance) having the same composition as gehlenite, or may be a platinum rod or an iridium rod.

Next, an RF coil of the heater 21 is electrified by a power source (not shown) for high frequency induction heating of the crucible 11, to thereby melt the raw materials in the crucible 11.

Then, the rod 17 for drawing up crystals is lift down to immerse the seed crystal 22 in the melt 23 of the raw materials. With slowly rotating the rod 17 for drawing up crystals at a predetermined speed of revolution in a predetermined direction, the rod is slowly drawn up at a constant speed. The speed of revolution and speed for drawing up the rod 17 is determined according to the size of the crystal to be grown. Through the above procedure, bulk of gehlenite in a shape of a monocrystalline rod is produced.

(Crystal Cutting-Out Step)

Then, in a crystal cutting-out step S11, a crystal piece is cut out from the crystal bulk produced in the crystal growing step S10 as the piezoelectric member 2 in a predetermined crystal orientation, such as a crystal piece cut out along with an (XYt) 45° orientation which is illustrated as II or III in the FIG. 2. The piezoelectric material 2 may be cut out using a wire-saw or a blade-saw, which is used for cutting out a semiconductor wafer. If needed, the surface of the cut-out piezoelectric member 2 may be finished by mirror polishing.

(Electrode Forming Step)

Finally, in an electrode forming step S12, the electrode 3 is formed on a first surface of the piezoelectric member 2 which was cut out in the crystal cutting-out step S11, and the electrode 4 is formed on a second surface which is separated from, or preferably opposite the first surface.

Electrodes 3 and 4 may be formed on the piezoelectric member 2 by applying paste (in which a powdery metal material is dispersed) on surfaces on which electrodes are to be formed. The paste may be baked after application. According to use, electrodes 3 and 4 may be formed by deposition, plating, spattering, or the like. The piezoelectric element 1 is produced through the above procedure.

Second Embodiment

Secondly, the piezoelectric element according to a second embodiment of the present invention will be described with referring to FIGS. 5A and 5B.

Figure 5A:
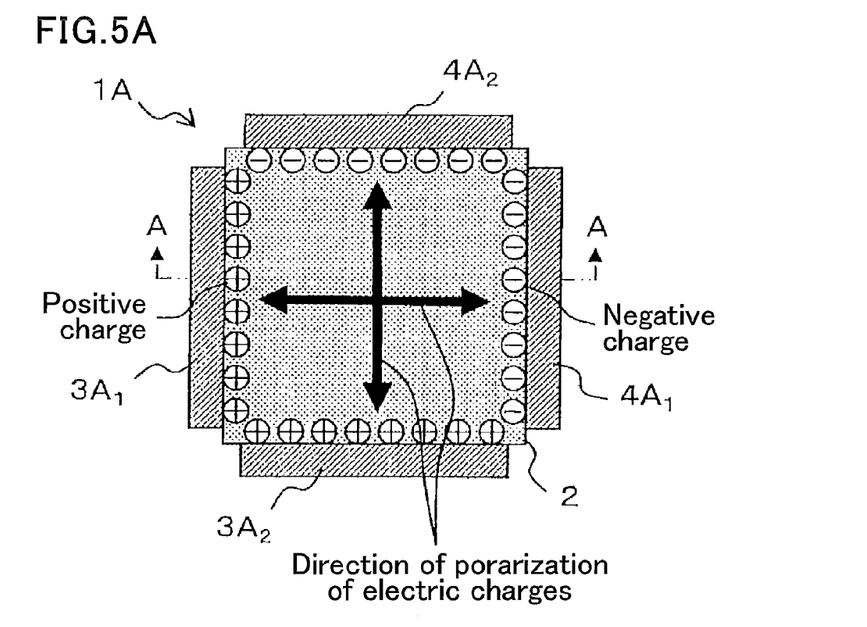
FIG. 5A is a plan view.
Figure 5B:
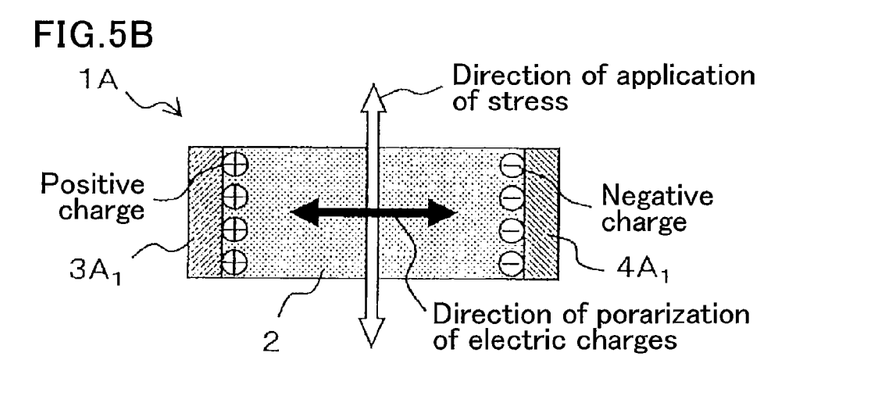
FIG. 5B is a sectional view of the FIG. 5A taken along the plane A-A.

A piezoelectric element 1A according to the second embodiment which is illustrated in FIGS. 5A and 5B has a substantially square prism piezoelectric member 2, and two pairs of electrodes $3A_1$ and $4A_1$ and electrodes $3A_2$ and $4A_2$. The piezoelectric element 1A according to this embodiment has a structure suitable for utilizing a transverse piezoelectric effect ($d_{31}$ mode).

A piezoelectric element 1A is equipped with a crystal piece of gehlenite as a piezoelectric member 2. The axis of application of stress directs a direction perpendicular to the upper face of the piezoelectric member 2 (in FIG. 5A, a direction perpendicular to the page, and in the FIG. 5B, the longitudinal direction of the page (vertical direction)). In the piezoelectric element 1A which utilizes a transverse piezoelectric effect, positive and negative electric charges are generated such that the charges are polarized in directions orthogonal to the axis of application of stress, that is, in lateral and longitudinal directions, respectively, of the page in FIG. 5A. Thus, the piezoelectric element 1A is equipped with a pair of electrodes $3A_1$ and $4A_1$ to detect electric charges polarized in the lateral direction of the page in FIG. 5A, and a pair of electrodes $3A_2$ and $4A_2$ to detect electric charges polarized in the longitudinal direction of the page in FIG. 5A.

Figure 5C:
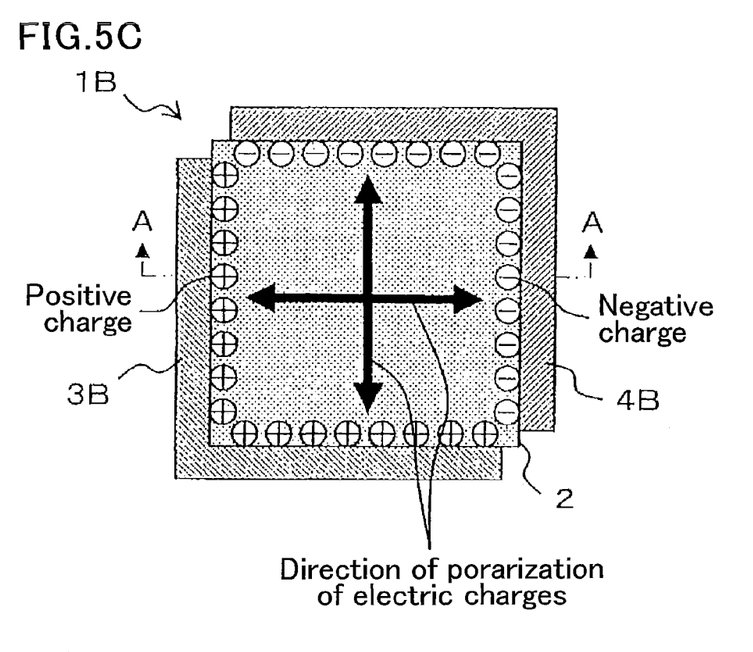
FIG. 5C is a plan view of a variant of the piezoelectric element.

In FIGS. 5A to 5C, the electrodes $3A_1$, $3A_2$, $4A_1$, and $4A_2$ are provided separately from each other. It is preferable to provide electrodes to cover substantially the whole of the side surface of the piezoelectric member 2 as long as short circuits do not occur between electrodes. Such an arrangement of electrodes enables to promote effective detection of generated electric charges and enhance sensitivity as a piezoelectric element. On detection of electric charges, electrodes which detects electric charges with the same polarity, that is, electrodes $3A_1$ and $3A_2$, or electrodes $4A_1$ and $4A_2$, may be electrically connected to detect electric charges generated on the piezoelectric member 2 as a whole.

The piezoelectric member 2 in the piezoelectric element 1A is preferably an (XYt) 45°-cut piece as the first embodiment. Here, the axis of application of stress (stressed direction) of the piezoelectric member 2 is an axis tilted 45° from the Y-axis around the X axis, and axes along which the electric charge are generated (polarized direction of electric charges) are two axes including the X-axis, and the axis tilted 45° from the Z-axis around the X axis.

The direction along which gehlenite of the piezoelectric member 2 in this embodiment are cut out is not limited to the (XYt) 45° orientation, and may be any other direction. The shape of the piezoelectric member 2 is not limited to a square prism, and may be a general rectangular parallelepiped shape. The shape may have a cylindrical shape or a polygonal column shape. Also when the piezoelectric member 2 has a cylindrical shape or a polygonal column shape, a pair of positive and negative electrodes are preferably provided such that the electrodes are separated from each other in a direction orthogonal to the surface to which stress is applied, and more preferably, are provided at positions opposite each other. Here, it is preferable that the positive and negative electrodes are provided on substantially a whole surface of a region in which a corresponding polar electric charge is generated, as long as short circuits do not occurred between the positive electrode and the negative electrode.

Variation Example

FIG. 5C illustrates a piezoelectric element of a variation example of the second embodiment. As illustrated in FIG. 5C, a piezoelectric element 1B according to this variation example is a modification of the piezoelectric element 1A of the second embodiment as illustrated in FIG. 5A. In the piezoelectric element 1B, the electrode $3A_1$ and the electrode $3A_2$ to detect electric charges with the same polarity are integrated into a single electrode 3B, and the electrode $4A_1$ and the electrode $4A_2$ are also integrated into a single electrode 4B. A section of the piezoelectric element 1B taken along the plane A-A is similar to the section of the piezoelectric element 1A taken along the plane A-A in FIG. 5B. Explanation on the configuration other than electrodes is omitted since the configuration is similar to the piezoelectric element 1A of the second embodiment.

As illustrated in FIG. 5C, piezoelectric element 1B has, in a plan view, electrodes are provided to cover the corner of the piezoelectric material 2 (in FIG. 5C, lower left and upper light corners). Thus, electric charges can be more effectively detected since electrodes 3B and 4B are provided in a wider region on the side surface of the piezoelectric member 2 than those of piezoelectric element 1A of the second embodiment. Thus, piezoelectric element 1B will have higher sensitivity as a piezoelectric element.

The piezoelectric element 1A of the second embodiment, and the piezoelectric element 1B of the variation example of the second embodiment may be produced from similar materials in a similar production process to those of the piezoelectric element 1 of the first embodiment. Thus, explanation of the production process is omitted.

Third Embodiment

Structure of a Pressure Sensor

A pressure sensor according to a third embodiment of the present invention is explained referring to FIG. 6. As illustrated in FIG. 6A, the pressure sensor 30 according to the third embodiment is equipped with a casing 31, a diaphragm 32, an insulation sleeve 33, a base 34, a piezoelectric element 1, an alumina plate 35, a sealer 36, a fixing thread 37, electric and wires 38 and 39.

Figure 6A:
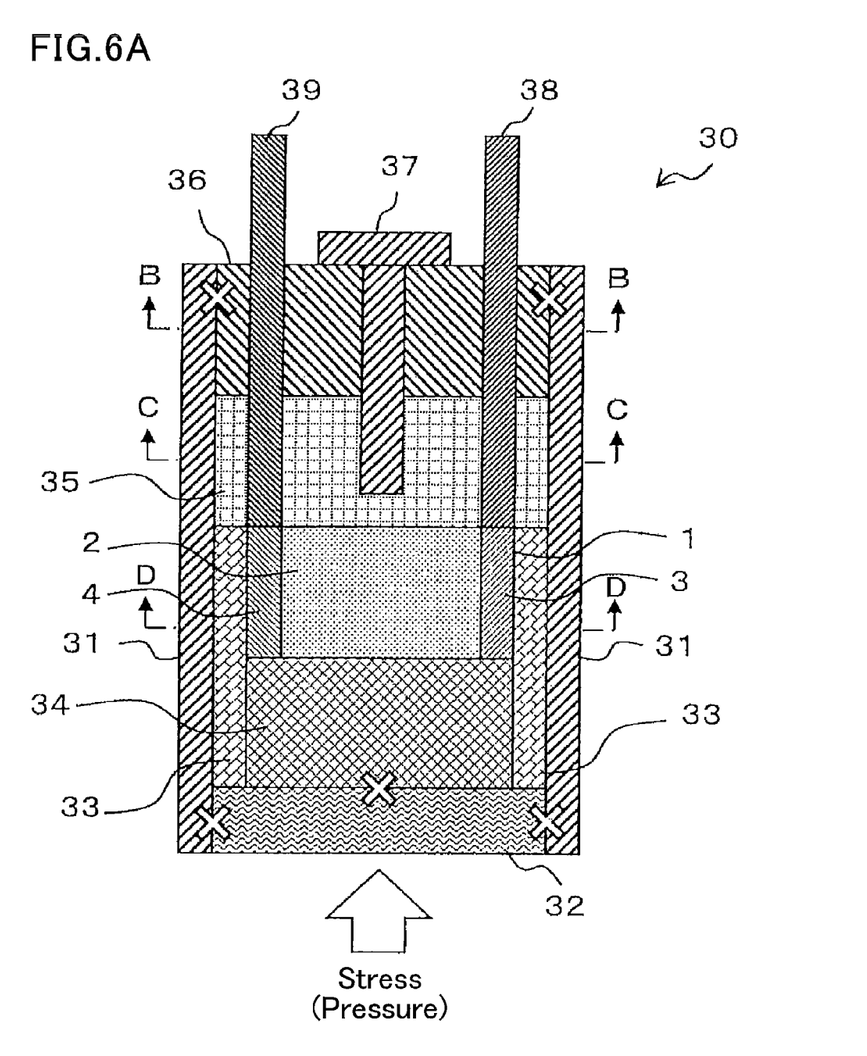
FIG. 6A is a longitudinal sectional view.

Pressure sensor 30 of this embodiment is, for example, directly fixed to a combustion chamber of an engine to measure combustion chamber pressure. Thus, the pressure sensor 30 is a sensor which endures hot environments. Parts constituting the pressure sensor 30 are made of a material having a heat resistance to over several hundreds degrees Celsius.

In the pressure sensor 30, stress occurred by pressure that is applied on the diaphragm 32 is transferred, via a base 34, to the piezoelectric member 2 of the piezoelectric element 1. Depending on the magnitude of the stress transferred to the piezoelectric member 2, electric charges generate on the electric charge-generating surfaces of the piezoelectric element 1 (the surfaces on which electrodes 3 and 4 are provided). To electric wires 38 and 39, a means for detecting electric charges (not shown), such as an electricity meter or a voltmeter, is connected in order to detect electric charges. Thus, pressure can be measured.

In this embodiment, the piezoelectric element 1 transforms stress (pressure) applied on the piezoelectric member 7 into electric charges under a transverse piezoelectric effect. Referring to FIG. 6A, stress applied to piezoelectric member 2 from downward generates positive and negative electric charges on the side faces of the piezoelectric member 2 such that electric charges are polarized in the lateral and vertical directions of the page, which are orthogonal to the direction in which stress is applied. Generated electric charges are detected via the electrodes 3 and 4, which are provided on the side surfaces of the piezoelectric member 2 such that the they are opposite each other in a polarized direction of positive and negative electric charges. The pressure sensor 30 according to this embodiment measures pressure on diaphragm 32 based on electric charge detected as explained above.

The casing 31 is a cylindrical casing made of a heat-resisting material such as stainless steel. At the bottom part of the casing 31, a diaphragm 32 is attached. The diaphragm 32 is a discoid part made of a heat-resisting material such as stainless steel, and the bottom face is a pressure receiving surface which receives target pressure. At the side of the top surface of the diaphragm 32, the piezoelectric element 1 is provided via the base 34 made of glass. Between the piezoelectric element 1 or the base 34 and the inner surface of the casing 31, an insulation sleeve 33 made of alumina is provided.

The piezoelectric element 1 in this embodiment includes a piezoelectric element which employs a piezoelectric crystal of gehlenite as the piezoelectric member 2, as shown as the piezoelectric element 1 according to the first embodiment in FIG. 1, the piezoelectric element 1A according to the second embodiment in FIG. 5A, or the piezoelectric element 1B according to a variation of the second embodiment in FIG. 5C. One example is illustrated as a sectional view in FIG. 6D.

Figure 6B:
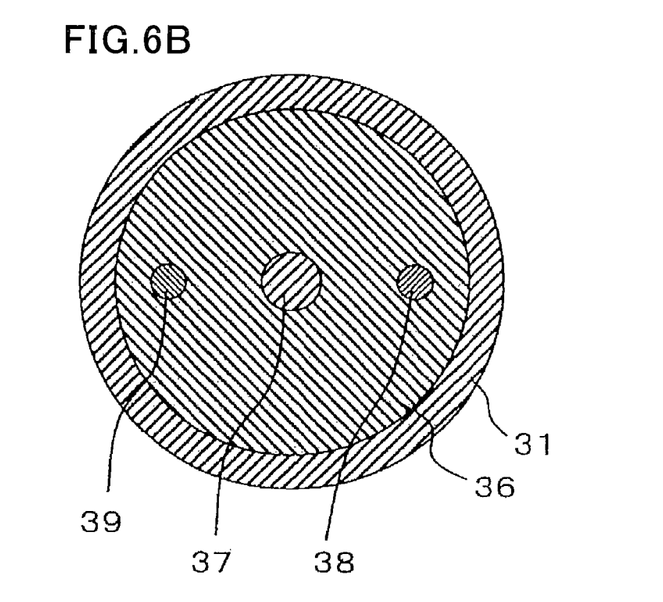
FIG. 6B is a transverse sectional view taken along the plane B-B of FIG. 6A.
Figure 6C:
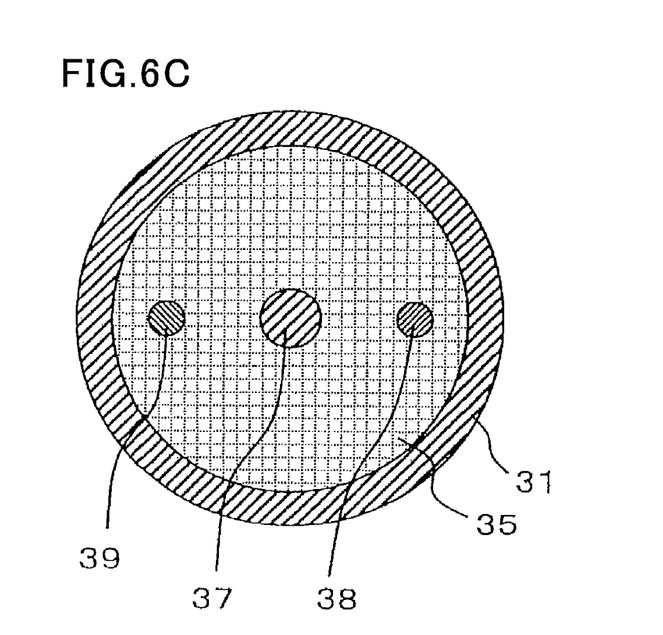
FIG. 6C is a transverse sectional view taken along the plane C-C of the FIG. 6A.
Figure 6D:
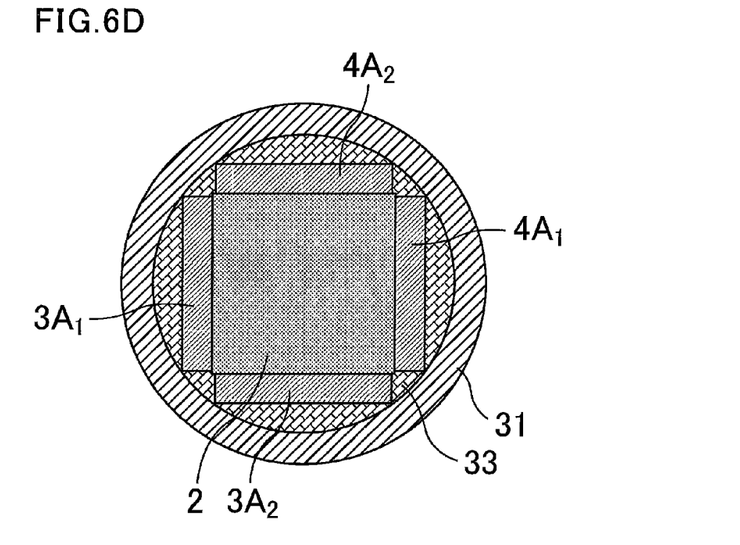
FIG. 6D is a transverse sectional view taken along the plane D-D of the FIG. 6A.

FIG. 6D illustrates an example in which piezoelectric element 1A, corresponding to the piezoelectric element of the FIG. 5A, is placed in the pressure sensor. The part numbered 33 corresponds to the insulation sleeve of FIG. 6A, but is not limited to. The part 33 may be filled with other filler, or may be a vacant space. A pair of electrodes $3A_1$ and $3A_2$ or another pair of electrodes $4A_1$ and $4A_2$ may be connected by wires so that generated charges should be efficiently recovered, as long as short circuits do not occur between electrodes.

The piezoelectric element 1 is provided on the top surface of the base 34, and stress occurred by pressure applied on the pressure receiving surface of the diaphragm 32 is transferred, via the base 34, to the stress-receiving surface of the piezoelectric member 2.

In the piezoelectric element 1, for utilizing a transverse piezoelectric effect, electrodes 3 and 4 are provided on the side surfaces of piezoelectric member 2 in a lateral direction of the page, which are orthogonal to the direction in which stress is applied to the piezoelectric member 2, or in a lateral direction of the page and a direction perpendicular to the page, such that the electrodes oppose each other.

The shape of the piezoelectric element 1 may be a prismatic shape, as illustrated in FIG. 1 or FIG. 5, or may be cylindrical shape so that it would be suit for the shape of the casing 31. Alternatively, a plurality of plate piezoelectric elements may be used. In this case, electrodes on piezoelectric elements with the same polarity may be connected to a corresponding electric wire 38 or 39.

The electrodes 3 and 4 of the piezoelectric element 1 are electrically connected to ends of the electric wires 38 and 39, respectively. The electric wires 38 and 39 may preferably be electric wires coated with a ceramic felt that has a sufficient heat resistance to endure hot environments. As illustrated in FIG. 6A, FIG. 6B, and FIG. 6C, the electric wires 38 and 39 run through through-holes on alumina plate 35 and sealer 36, and the other ends are exposed from the top face of the sealer 36. The ends are connected to an external detection means for electric charges (not shown).

On the upper side of the piezoelectric element 1, an alumina plate 35, which is an insulation member, is provided. Further on the upper side of the alumina plate 35, a sealer 36 made of a heat-resisting material such as stainless steel is further provided. The casing 31 is joined to the diaphragm 32 and the sealer 36 at the sites indicated by white "X" marks in FIG. 6A. The diaphragm 32 and the base 34 are also joined together at the center.

In the plan view, a fixing thread 37 is provided at the center of the sealer 36. The thread 37 penetrates the sealer 36, and is screwed to around the middle in the thickness direction of the alumina plate 35. The fixing thread 37 fixes parts which will be arranged in the casing 31 in predetermined positions. The fixing thread 37 may be made of Fe—Ni type alloys.

The shape of the casing 31 is not limited to cylindrical, and may also be a square pole shape, a polygonal column shape, and the like. The pressure sensor 30 may be designed, for example, to be threadedly engaged into a predetermined mounting hole, which communicates with an engine combustion chamber, in a similar way to the fitting of a spark plug by making screw threads in the periphery of an end of the casing 31.

[Operation of the Pressure Sensor]

Now, operation of the pressure sensor 30 is further explained referring to FIG. 6. The pressure sensor 30 receives pressure from, for example, an engine combustion chamber on a pressure receiving surface that is at the bottom of the diaphragm 32. Stress caused by the pressure on the diaphragm 32 is transmitted, via the base 34, to the piezoelectric member 2 of the piezoelectric element 1. The piezoelectric member 2 deforms due to transmitted stress, and generates electric charges depending on the degree of deformation under a transverse piezoelectric effect. Positive and negative electric charges which are generated on the piezoelectric member 2 go through the electrodes 3 and 4, and are detected by a detection means of electric charges (not shown) that is connected to electric wires 38 and 39. Thus, physical quantities relating to the generated electric charges, such as voltage or quantity of electricity, are measured. Pressure received by the diaphragm 32 may be determined from the physical quantities such as voltage or quantity of electricity.

EXAMPLES

A piezoelectric element of the present invention which was constructed as a working example is explained. A piezoelectric material used for the piezoelectric element, constructed as a working example, was produced in the Czochralski method using an apparatus 10 for growing crystals as illustrated in FIG. 4. Here, calcium carbonate, aluminum oxide, and silicon oxide, each of which was in a 99.99%-pure powdery form, were used as raw materials. These raw materials were weighed according to the composition of gehlenite ($Ca_2Al_2SiO_7$), and then mixed.

Next, a powdery mixture of raw materials was charged in an iridium crucible (the crucible 11 in FIG. 4), and set in an apparatus 10 for growing crystals, which is illustrated in FIG. 4. The iridium crucible was in a cylindrical shape with an inner diameter of 50 mm and a height of 50 mm. As a seed crystal, a single crystal of gehlenite was used.

Using the apparatus 10 for growing crystals, a rod-shaped crystal bulk with a diameter of about 20 mm and a length of about 80 mm was prepared in a procedure as described above.

Then, from the crystal bulk, a plate crystal piece which had a rectangular shape in a plan view of an (XYt) 45°-cut piece was cut out as a piezoelectric member. Powdery platinum was applied to the front and back faces of the piezoelectric member to form electrodes. In the above manner, a piezoelectric element was constructed.

Then, as characteristic values of a piezoelectric element, piezoelectric constant $d_{31}$ and electric resistivity were measured under varying temperature on a sample of the piezoelectric element which was constructed as a working Example, and samples of other piezoelectric elements that included some other piezoelectric materials as comparative Examples.

Piezoelectric materials used for comparative Examples are $GaPO_4$ (gallium phosphate), LTG (rare earth containing langasite: $La_3Ta_{0.5}Ga_{5.5}O_{14}$), LTGA (rare earth containing langasite: $La_3Ta_{0.5}Ga_{5.5-x}Al_xO_{14}$), LGS (langasite: $La_2Ga_5SiO_{14}$), and YCOB (rare earth calcium oxoborate: $YCa_4O(BO_3)_3$).

For measurement of characteristics, an Impedance Analyzer HP 4294A, manufactured by Hewlett-Packard Development Company, L.P., was used. A piezoelectric constant $d_{31}$ was calculated based on electromechanical coupling factors ($k_{31}$ and $k_p$) of each sample, which were measured according to a resonance/anti-resonance method. The electric resistivity was measured according to a three-terminal method.

Figure 7:
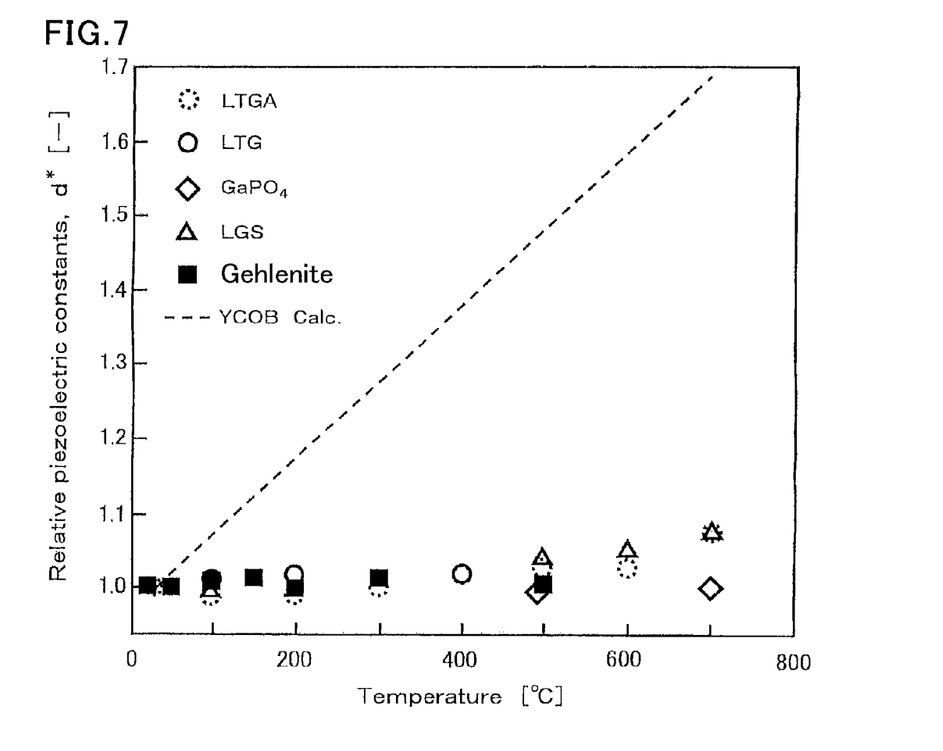
FIG. 7 is a graph illustrating temperature dependability of electric resistivity of piezoelectric elements of Examples and comparative Examples.

FIG. 7 shows temperature stability of piezoelectric constants measured on samples of the piezoelectric elements constructed in working examples or comparative Examples. In the graph illustrated in FIG. 7, the abscissa axis denotes temperatures (by centigrade), and the ordinate axis denotes relative piezoelectric constants "d*." Here, a "relative piezoelectric constant, d*, means a relative value to a piezoelectric constant $d_{31}$ at a room temperature and may be calculated from the formula (1):

$$d^* = (d_{31} \text{ at a temperature})/(d_{31} \text{ at a room temperature}) \quad (1)$$

In the examples, the "room temperature" means a temperature within the range of 15 to 35° C.

Figure 8:
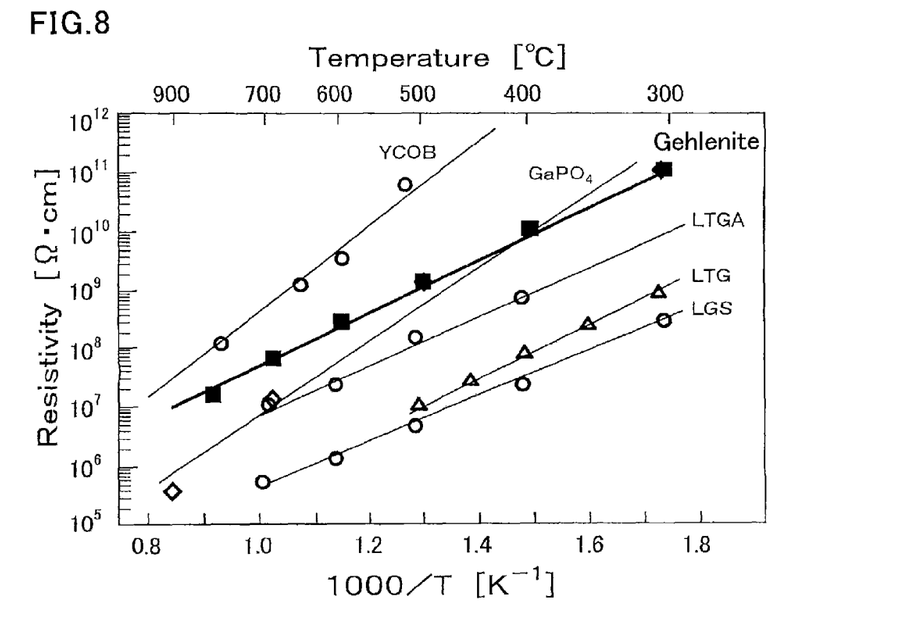
FIG. 8 is a graph illustrating thermal stability of piezoelectric constants measured on piezoelectric elements of Examples and comparative Examples.

FIG. 8 shows temperature dependability of electric resistivity measured on samples of piezoelectric elements, which are constructed as working examples and comparative Example. In the graph of FIG. 8, the abscissa axis denotes a coordinate axis that is in direct proportion to reciprocals of the absolute temperature T (1000/T). For reference, centigrade scale is appended above the graph. The ordinate axis denotes a logarithmic scale of electric resistivity.

As illustrated in FIG. 7, a sample of a working example, in which gehlenite was used, showed such a small variation as within the range of ±2% in the piezoelectric constant $d_{31}$ in the range from a room temperature to high temperature region, and thus showed a stable piezoelectric property. This temperature stability of a piezoelectric property was comparable or superior to those of other comparative Examples even except the result of YCOB, which showed great variation with temperature in a piezoelectric property.

In FIG. 5, the piezoelectric property of YCOB denotes a calculated value.

Further, as illustrated in FIG. 8, a sample of a working example, in which gehlenite was used, showed high electric resistivity even in a high temperature region. In particular, a sample of a working example showed a higher electric resistivity than those of comparative Examples other than YCOB at 400° C. or higher. Further, excellent insulation was maintained even at 800° C.

As explained above, use of gehlenite as a piezoelectric material can provide a piezoelectric element which endures hot environments.

The constructed piezoelectric element can be used as a sensor such as a pressure sensor or an ultrasonic sensor. Such a pressure sensor can be used as a combustion pressure sensor in a combustion chamber of an engine. Such an ultrasonic sensor can be installed on an external wall of a boiler, a steam pipe, turbine, or the like in a high temperature plant of a thermal power plant for monitoring the high temperature plant.

Applications of the piezoelectric element according to the present invention are not limited to these. Gehlenite have neither a phase transition point nor a Curie point under the melting point. Thus, a piezoelectric element in which gehlenite is used as a piezoelectric material, can be used as an element for wide range of use, which can basically be used as an element in a wide range of temperature environments from a room temperature to a temperature under the melting point of gehlenite.

What is claimed is:

1. A method for using a piezoelectric material, comprising:
    using the piezoelectric material in an atmosphere of 400° C. or higher,
    wherein the piezoelectric material comprises gehlenite represented by the compositional formula $Ca_2Al_2SiO_7$.

2. The method according to claim 1, wherein the piezoelectric material is included in a piezoelectric member.

3. The method according to claim 2, wherein the piezoelectric member is included in a piezoelectric element and has a surface for receiving external stress and a side surface that is perpendicular to the surface for receiving external stress; and
    the piezoelectric element comprises at least one pair of a first electrode and a second electrode that are placed on the side surface such that the first electrode is separated from the second electrode.

4. The method according to claim 3, the electrodes are provided such that the electrodes cover substantially the whole of the side surface.

5. The method according to claim 3, wherein the piezoelectric member is cut out from a crystal of the piezoelectric material along with an (XYt) 45° orientation.

6. The method according to claim 3, wherein the electrodes are made of a material selected from the group consisting of Pt, Pd, and Ag—Pd alloy.

7. The method according to claim 3, wherein the piezoelectric element is included in a pressure sensor comprising a diaphragm,
    wherein the piezoelectric element is provided such that stress caused by external pressure on the diaphragm is transmitted to a stress-receiving surface of the piezoelectric member, and electric charges generated in the piezoelectric member by the thus-transmitted stress are detected via the electrodes.

8. The method according to claim 7, comprising:
    sensing an operation pressure with the pressure sensor, wherein the pressure sensor is exposed to an environment of at least 400° C. during operation of an apparatus including the pressure sensor.

* * * * *

UNITED STATES PATENT AND TRADEMARK OFFICE
CERTIFICATE OF CORRECTION

PATENT NO. : 9,522,827 B2
APPLICATION NO. : 13/875853
DATED : December 20, 2016
INVENTOR(S) : Tsurumi It is certified that error appears in the above-identified patent and that said Letters Patent is hereby corrected as shown below:

In the Claims

Column 14, Line 29: After "$Ca_2Al_2SiO_7$" delete "." and insert --wherein the gehlenite is monocrystal and has piezoelectricity.--.

Signed and Sealed this
Eighteenth Day of April, 2017

Michelle K. Lee
*Director of the United States Patent and Trademark Office*